United States Patent
Stikvoort et al.

(10) Patent No.: US 6,192,229 B1
(45) Date of Patent: Feb. 20, 2001

(54) DIODE MIXER CIRCUIT

(75) Inventors: Eduard F. Stikvoort; Petrus G. M. Baltus; Antoon M. H. Tombeur, all of Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/207,526

(22) Filed: Dec. 8, 1998

(30) Foreign Application Priority Data

Dec. 15, 1997 (FR) .................................................. 97 15881

(51) Int. Cl.[7] ...................................................... H04B 1/00
(52) U.S. Cl. ............................................ 455/330; 455/331
(58) Field of Search .................................. 455/313, 323, 455/326, 330, 331

(56) References Cited

U.S. PATENT DOCUMENTS

| | | | |
|---|---|---|---|
| 3,983,489 | * | 9/1976 | Gittinger ................................ 455/331 |
| 4,355,420 | * | 10/1982 | Ishihara ................................. 455/330 |
| 6,118,992 | * | 9/2000 | Watanabe ............................... 455/330 |

OTHER PUBLICATIONS

By James K. Hardy, "High–Frequency Circuit Design" Preston Publishing Company, 1979, pages 318.

* cited by examiner

Primary Examiner—Reinhard Eisenzopf
Assistant Examiner—Makoto Aoki
(74) Attorney, Agent, or Firm—Dicran Halajian

(57) ABSTRACT

In a diode mixer circuit MIX, a driving circuit DRIV produces a first, second, third and fourth drive signal DS1, DS2, DS3, DS4. Each drive signal is a combination of a first and a second input signal LO, RF with the following signs:

DS1: +LO+RF

DS2: +LO−RF

DS3: −LO+RF

DS4: −LO−RF

A first, second, third and fourth diode D1, D2, D3, D4 transfer the first, second, third and fourth drive signal DS1, DS2, DS3, DS4 respectively, to an output O1. The first and fourth diodes D1, D4 have the same polarity relative to the output. The second and third diodes D2, D3 also have the same polarity relative to the output, but opposite to that of the first and fourth diodes D1, D4.

A mixer circuit of this type is suitable for a relatively large variety of applications, notably because it may be realized in the form of an integrated circuit.

4 Claims, 4 Drawing Sheets

DIODE MIXER CIRCUIT

FIELD OF THE INVENTION

The invention relates to a diode mixer circuit for mixing a first and a second input signal. The invention also relates to a receiver in which a reception signal and a beat signal are mixed so as to obtain an intermediate frequency signal.

BACKGROUND OF THE INVENTION

The book entitled "High-Frequency Circuit Design" by James K. Hardy, Preston Publishing Company, 1979, pp. 317–318, describes mixer circuits. The FIG. 10–6(f) of this book shows a mixer circuit having a double-balance structure (double balanced mixer). The circuit includes four diodes which are connected so that they form a ring. The diode ring receives a radio-frequency signal (RF) and an oscillator signal (OSC) via a transformer. An intermediate frequency signal (IF) is obtained via another transformer. Thanks to the double-balance structure, relatively little remains of the oscillator signal in the intermediate frequency signal.

SUMMARY OF THE INVENTION

It is an object of the invention to provide a diode mixer circuit which allows of a larger variety of applications.

The invention takes the following aspects into consideration. In the prior art, each transformer should process signals in a substantially symmetrical manner and without too many losses, for the mixer circuit to have a satisfactory performance. The manufacturing of a transformer requires special materials and a relatively complex method. Moreover, such a transformer is to have certain minimum dimensions; the transformer cannot be miniaturized at will without degrading its performance. Thus, the transformer is a relatively costly and relatively bulky element. In consequence, the mixer circuit according to the prior art is not suitable for use in low-cost applications such as, for example, in the field of consumer electronics. Neither is it suitable for miniature applications such as, for example, portable receivers.

According to the invention, a diode mixer circuit comprises a driving circuit for producing a first, second, third and fourth drive signal. Each drive signal is a combination of a first and a second input signal. The first and the second input signal (LO, RF) have the following signs in the first, second, third and fourth drive signal: +/+, +/−, −/+ and −/−, respectively. In addition, there is a group of diodes comprising a first, second, third and fourth diode. These diodes are coupled for transferring the first, second, third and fourth drive signal respectively, to an output. The first and fourth diodes have the same polarity relative to the output. The second and third diodes also have the same polarity relative to the output, but opposite to that of the first and fourth diodes.

The driving circuit can be realized without utilizing a transformer. For example, the driving circuit may be realized by using only transistors, resistors and capacitors. The group of diodes can be connected to the output without the intervention of such a transformer. Thus, a mixer circuit according to the invention does not need a transformer unlike the mixer circuit according to the prior art. In consequence, a diode mixer circuit according to the invention can be used in applications for which the mixer circuit according to the prior art is not suitable because of the fact that it contains transformers. Thus, the invention makes a larger variety of applications possible.

More particularly, a diode mixer according to the invention can be realized in the form of an integrated circuit, whereas this is practically impossible for the prior-art circuit. Certain applications require that a mixer circuit is realized in the form of an integrated circuit, for example, for reasons of cost and/or dimensions. Thus the invention allows the use of a diode mixer circuit in such an application.

Another advantage of the invention is the following. A diode mixer circuit is capable of reaching a relatively favorable performance, notably in terms of noise and distortion. As explained above, the invention allows the use of a diode mixer circuit in an application for which the mixer circuit according to the prior-art is unsuitable. Thus, the invention allows such an application to benefit from favorable performance of a mixer circuit included therein.

The invention may advantageously be applied in a receiver. In general, the frequency of an input signal of a receiver is converted by mixing it with a signal coming from an oscillator. The invention permits this frequency conversion to be realized with a diode mixer circuit even in the case where the receiver is to be relatively inexpensive and/or relatively small. It has already been mentioned that a diode mixer circuit is capable of reaching a low noise level and a low distortion level. Thus, the invention makes it possible to carry out the frequency conversion without affecting the input signal too much. In general, the processing of the input signal as regards frequency conversion influences the performance of the receiver to a large extent. Consequently, the invention may considerably contribute to a satisfactory performance level of the receiver.

These and other aspects of the invention will be apparent from and elucidated with reference to the embodiments described hereinafter.

DESCRIPTION OF PREFERRED EMBODIMENTS

Figure 1:
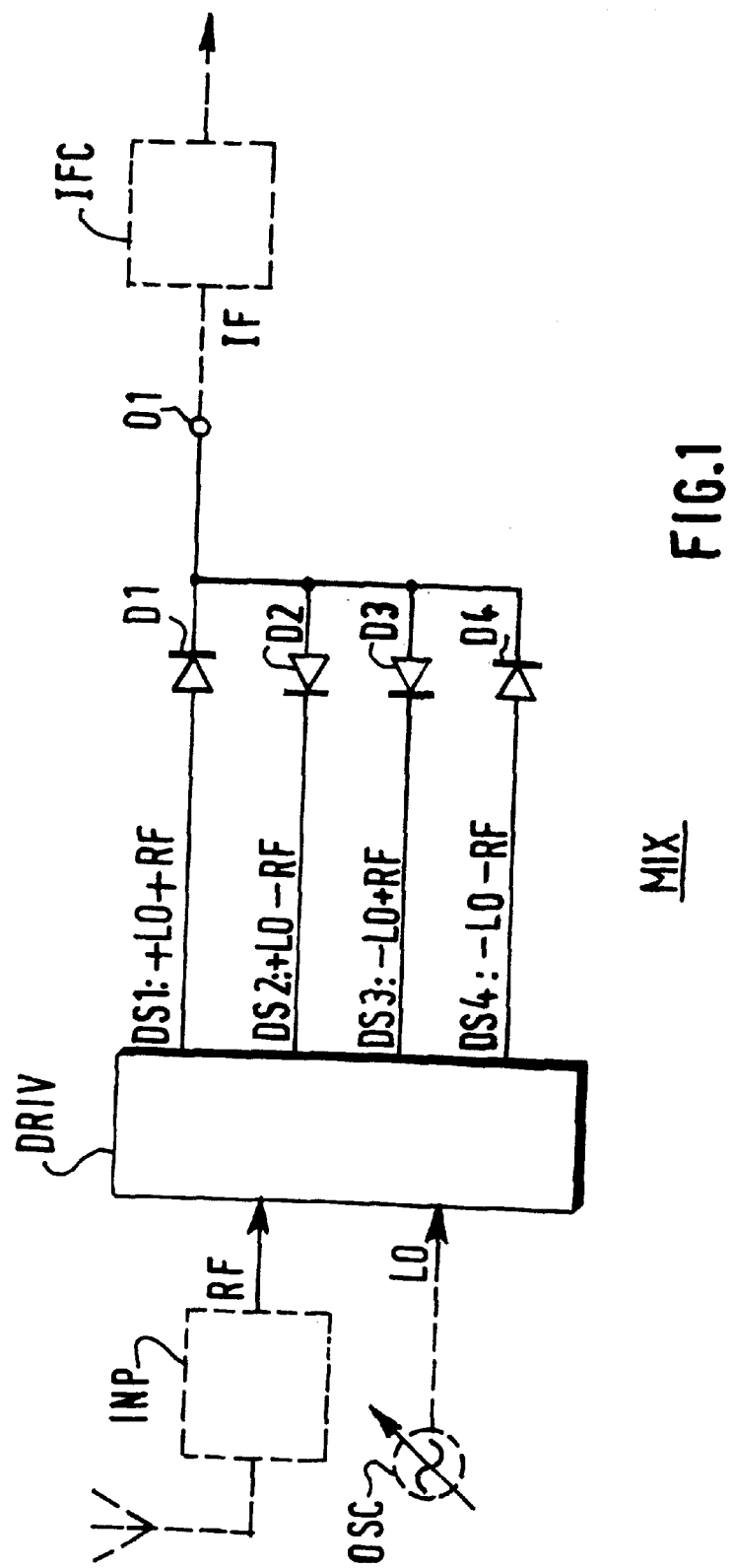
FIG. 1 illustrates basic features of the invention as claimed in the first claim.

The following remarks relate to the reference characters. Similar entities are designated by a reference of identical letters in all the Figures. Several similar entities may appear in a single Figure. In that case, a digit is added to the letter reference in order to distinguish between similar entities. The Figure may be omitted for convenience. This applies to the description as well as the claims.

FIG. 1 illustrates basic features of the invention in solid lines. A diode mixer circuit MIX receives a first and a second input signal LO,RF which are to be mixed. The diode mixer circuit MIX includes a driving circuit DRIV and a group of diodes D1–D4.

The driving circuit DRIV produces a first, second, third and fourth drive signal DS1, DS2, DS3, DS4. Each drive signal is a combination of the first and the second input signal LO,RF having the following signs:

DS1: +LO+RF

DS2: +LO−RF

DS3: −LO+RF

DS4: −LO−RF.

The group of diodes D1–D4 contains a first, second, third and fourth diode D1, D2, D3 and D4. These diodes are coupled for transferring the first, second, third and fourth drive signal DS1, DS2, DS3, DS4 respectively, to an output O1. The first and the fourth diode D1, D4 have the same polarity relative to the output. The second and the third diode D2, D3 also have the same polarity relative to the output, but opposite to that of the first and fourth diodes D1, D4.

The diode mixer circuit MIX operates as follows. The polarity of the input signal LO determines which of the diodes D1, D2, D3, D4 are conductive and which are non-conductive. If the polarity of the input signal LO is positive, the first and third diodes D1, D3 are conductive, whereas the second and fourth diodes D2, D4 are non-conductive. In that case, the input signal RF having the "+" sign will appear on the output O1. On the other hand, if the polarity of the input signal LO is negative, the second and fourth diodes D2, D4 are conductive, whereas the first and third diodes D1, D3 are non-conductive. In that case, the input signal RF having the "−" sign will appear on the output 01. Thus, on the output O1 will appear the input signal RF whose sign is alternated in timing with the input signal LO. This corresponds to a multiplication of the input signal RF by the input signal LO. Thus, on the output O1 will appear a signal that is a mixture of the two input signals.

It should be observed that, in principle, neither of the two input signals appears on the output O1 of the diode mixer circuit MIX. Firstly, there is no path via which the input signal RF may continuously flow to the output O1; there is always a periodic sign alternation. Secondly, both of the diodes which are conductive receive the input signal LO of opposite polarity, these two diodes being the first and third diodes D1, D3 or the second and fourth diodes D2, D4. Thus, the input signal LO fades at the point between the two conductive diodes. The output O1 is connected to this point. Consequently, in principle there is no remainder of the input signal LO on the output O1.

FIG. 1 shows other aspects of the invention by means of dashed lines. The diode mixer circuit MIX forms part of a receiver REC which further includes an input circuit INP, an oscillator OSC and an intermediate frequency circuit IFC. The input circuit INP processes a received signal. The oscillator OSC produces a beat signal. The mixer circuit MIX mixes the received circuit processed by the input circuit INP and the beat signal produced by the oscillator OSC, so that an intermediate frequency signal IF is obtained. Thereafter, the intermediate frequency circuit IFC processes the intermediate frequency signal IF.

Figure 2:
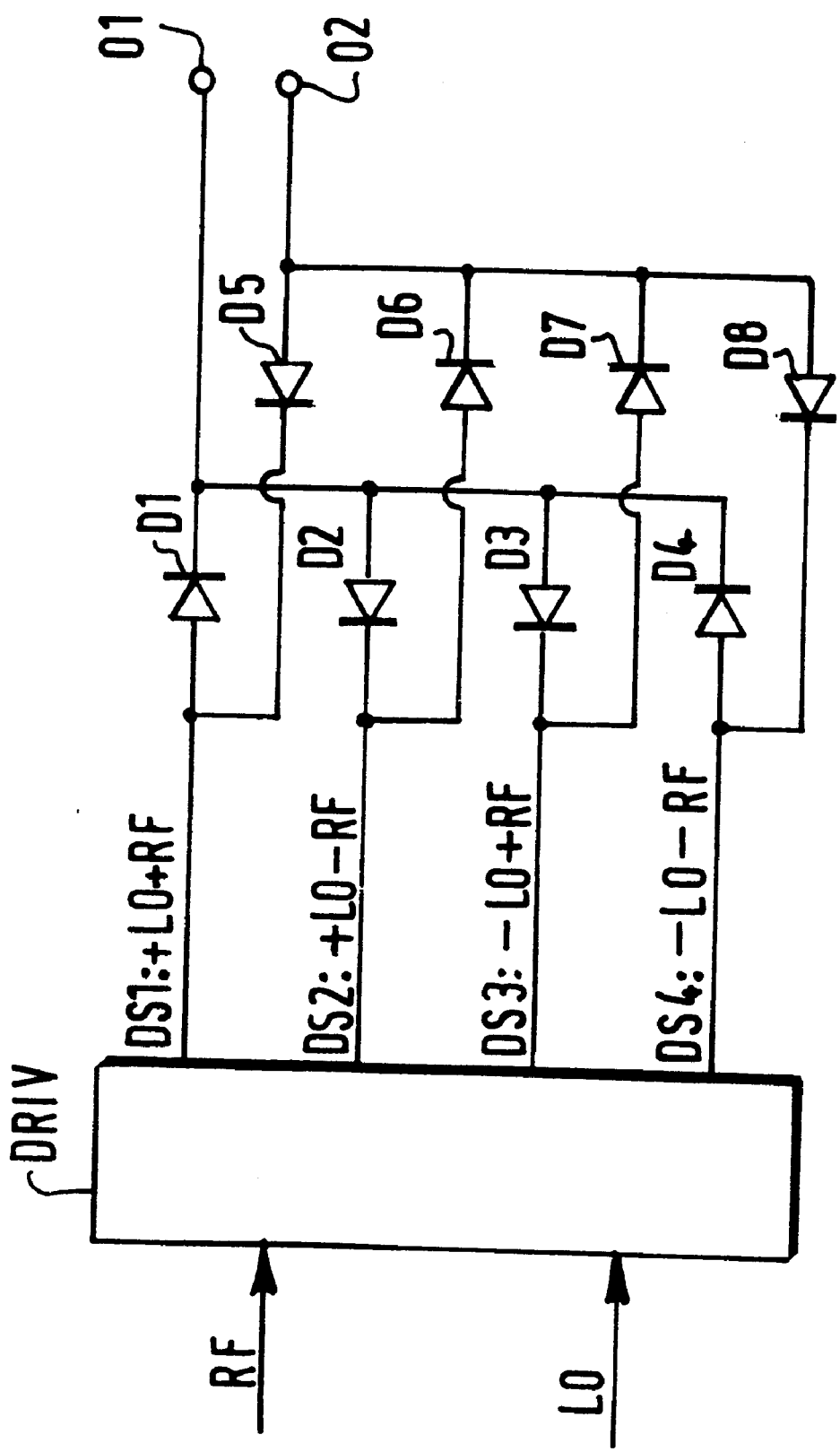
FIGS. 2 and 3 illustrate additional features as claimed in the second and third claim respectively.

FIG. 2 shows additional characteristics for applying the invention in an advantageous manner. The mixer circuit MIX includes an additional group of diodes D5–D8. The additional group of diodes contains a fifth, sixth, seventh and eighth diode (D5, D6, D7, D8). These diodes are coupled for transferring the first, second, third and fourth drive signal (DS1, DS2, DS3, DS4) respectively, to an additional output (O2). The fifth, sixth, seventh and eighth diodes (D5, D6, D7, D8) are coupled the other way around relative to the first, second, third and fourth diodes (D1, D2, D3, D4), respectively.

The following aspects are taken into consideration with respect to these additional characteristics. In order that no remainder whatsoever of an input signal RF and LO is left on output O1, the following condition is to be satisfied. In all the drive signals DS1, DS2, DS3, DS4, the part of the input signal RF or LO is to be perfectly the same in terms of amplitude. In practice, it is almost impossible to satisfy this condition among other things because of the tolerances of the components forming the driving circuit DRIV.

If the characteristic features illustrated in FIG. 2 are applied, a differential output signal is obtained between the output O1 and the output O2. If, because of imperfections in the drive signals DS1, DS2, DS3, DS4 as described above, a remainder of an input signal appears on the output O1, a remainder which is substantially the same will appear on the output O2. Consequently, there will be less remainder in the differential output signal. Thus, the characteristic features illustrated in FIG. 2 permit of a relatively low remainder level.

Another advantage of the characteristic features illustrated in FIG. 2 is the following. The diodes D1–D8 form load impedance for the driving circuit DRIV. If the polarity of the input signal LO is positive, the diodes D1 and D3 are conductive and determine the load impedance between the outputs of the driving circuit DRIV which produce the drive signals DS1 and DS3. If the polarity of the input signal LO is negative, diodes D5 and D7 are conducting and determine the load impedance between the same outputs of the driving circuit. Thus, the load impedance between the outputs of the driving circuit DRIV, which outputs supply the drive signals DS1 and DS3, is continuously formed by two conducting diodes. This also applies to the load impedance between the outputs which supply the drive signals DS2 and DS4. Thus, if the characteristics shown in FIG. 2 are applied, the driving circuit DRIV is connected to relatively stable load impedances. If, on the other hand, the driving circuit DRIV were connected to load impedances which considerably vary as a function of the amplitude of the drive signal, this could be harmful to the performance of the mixer circuit. Consequently, the characteristics shown in FIG. 2 contribute to a satisfactory performance.

Figure 3:
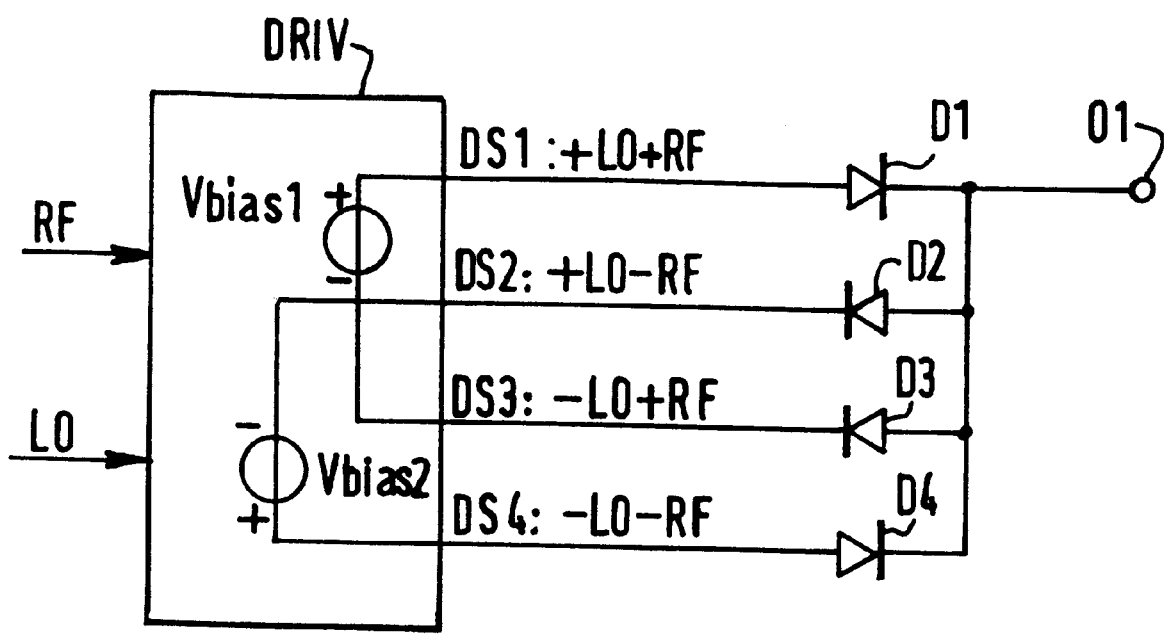

FIG. 3 shows additional characteristics for applying the invention in an advantageous manner. The driving circuit DRIV is capable of producing bias voltages Vbias1, Vbias2 between the first and third diodes D1, D3 and between the second and fourth diodes D2, D4, respectively.

The following aspects have been taken into consideration relative to these additional characteristics. As mentioned above, the diodes of the mixer circuit are alternately rendered conductive and non-conductive by the input signal LO. This is understood to mean that there is successively a certain period during which a diode is conductive and, thereafter, a certain period during which the diode is non-conductive. If these two periods are different, a remainder of the input signal RF will appear on the output O1. Furthermore, the effectiveness of the mixer circuit diminishes in proportion to a difference between the two periods. Thus, it is desirable that the periods in which the diodes are conductive and non-conductive respectively are substantially equal.

If the characteristics shown in FIG. 3 are applied, the diodes D1, D3 undergo a superpositioning of the input signal LO and of the bias voltage Vbias1. The diodes D1, D3 will be conductive if the level of this superpositioning is higher than a certain threshold, which is right for the diodes D1, D3 and they will be non-conductive if the level is lower than this threshold. The bias voltage Vbias1 determines at which level of the input signal LO the threshold is reached and thus a transition of conductivity takes place. Because of the fact that there is a fixed ratio between the level of the input signal LO and time, the periods of conductivity and non-conductivity of the diodes D1 D3 vary as a function of the bias voltage Vbias1. In the same manner, the periods of conductivity and non-conductivity of the diodes D2, D4 vary as a function of the bias voltage Vbias2. In consequence, the bias voltages Vbias1, Vbias 2 permit to equalize the periods in which the diodes D1, D2, D3, D4 are conductive and non-conductive. Thus, the characteristics shown in FIG. 3 contribute to a satisfactory performance of the mixer circuit notably in terms of a small remainder and high efficiency.

Figure 4:
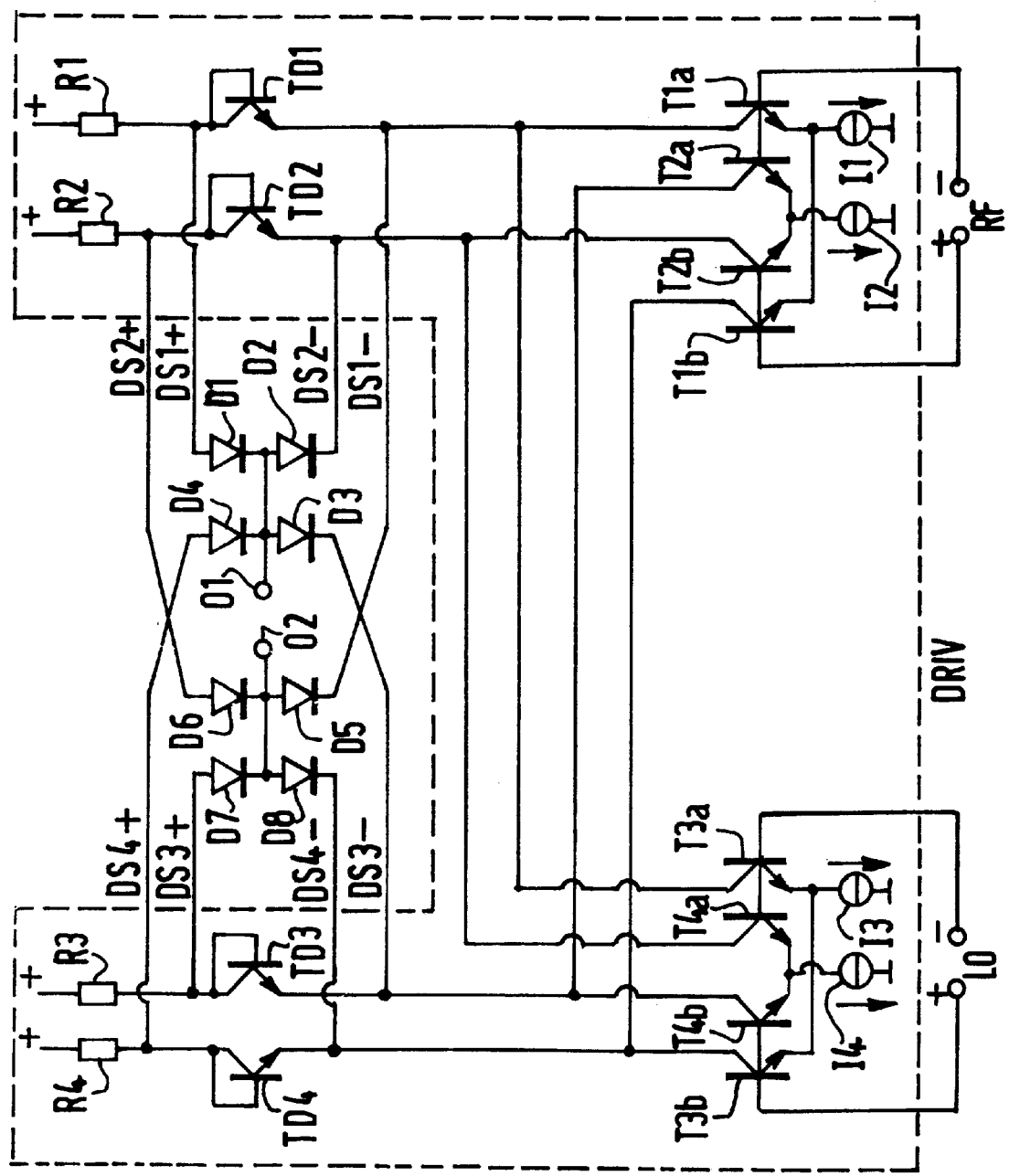
FIG. 4 shows an example of a mixer circuit according to the invention.

FIG. 4 shows an example of a diode mixer circuit according to the invention. This example contains the characteristics shown in FIGS. 1 to 3 which have been described above with reference to these Figures. In this example, the input signals RF and LO are different signals. Each of the drive signals DS1–DS4 exist in two versions which are indicated by adding the "+" and "−" sign, respectively. The two versions are distinguished by their DC voltage levels. The DC voltage of the "+" version is higher than that of the "−" version.

The driving circuit DRIV comprises four differential pairs of transistors T1a/T1b, T2a/T2b, T3A/T3band T4a/Tbhaving a current source I1, I2, I3 and I4, respectively. Furthermore, the driving circuit DRIV includes four transistors TD1, TD2, TD3, and TD4 which have a diode configuration, and four resistors R1, R2, R3 and R4. The transistors TD and the resistors R form load impedances for the differential pairs of transistors.

The driving circuit DRIV operates as follows. The differential pairs T1a/T1b and T2a/T2b receive the input signal RF and supply it in the form of current via the collectors. The differential pairs T3a/T3b and T4a/T4b do the same for the input signal LO. Each transistor having a reference sign ending in "a" changes the sign of the input signal concerned from "−" into "+", whereas each transistor having a reference sign ending in "b" changes the sign of the input signal concerned from "+" into "−".

The input signals RF and LO in the form of currents are easily combined. This is done by connections between the collectors of the differential pairs T1a/T1b and T2a/T2b, on the one hand, and the collectors of the differential pairs T3a/T3b and T4a/T4b, on the other hand. The connections are such that they produce four combinations in which the input signals LO and RF have the signs +/+, +/−, −/+ and −/−, respectively. These four combinations form the drive signals DS1, DS2, DS3 and DS4, respectively.

Each combination of input signals LO and RF in the form of currents is applied directly to one of the diodes D1–D8, on the one hand, and via a transistor TD arranged as a diode on the other hand. The combinations which are applied directly form the "−" versions of the drive signals DS and the combinations which are applied via the transistors TD form the "+" versions. Thus, bias voltages are obtained between the diodes D1 and D3, the diodes D2 and D4, the diodes D5 and D7 and the diodes D6 and D8. The bias voltages are determined by base-emitter junctions of the transistors TD, the respective values of resistors R and the DC currents supplied by the sources I. If the latter currents are equal and if all the resistors R have the same value, the bias voltages will equalize the voltage through base-emitter junctions which is typically comprised between 0.6 and 0.8 volt.

Preferably, if the diode mixer circuit is realized in the form of an integrated circuit, the substrate of the integrated circuit is electrically insulating. This preference is linked with the following aspects which are taken into consideration.

In practice, a diode cannot be rendered conductive instantaneously after it has been non-conductive and vice versa. This is understood to mean that there is always a certain delay of transition during which the diode is semi-conductive. When the diode is semi-conductive, it produces relatively much noise. This may be detrimental to the performance of the mixer circuit in terms of noise, notably when the input signals are high-frequency input signals. If the input signals are high-frequency input signals, the transitions of conductivity follow in rapid succession. Consequently, the diodes will be noisy during a part of the time under consideration.

If the integrated circuit including the diode mixer has a non-conductive substrate, there are no parasitic capacitances between the diodes and the substrate. On the other hand, if the substrate is semi-conductive as for most of the integrated circuits, considerable parasitic capacitances will exist between the diodes and the substratum. The lower the value of the parasitic capacitances is, the higher is the speed with which a change may be made from the conductivity of the diodes and, consequently, the shorter will be the periods during which the diodes are causing noise. Thus, a non-conductive substrate contributes to a satisfactory performance of the mixer circuit in terms of noise, notably high-frequency noise.

Furthermore, it is preferable for the diodes D to be of the Schottky type. The diodes of this type may change conductivity in a relatively brief period of time. Consequently, if the diodes D in the mixer circuit are of the Schottky type, the periods of noise of these diodes will be relatively short. Thus, the use of Schottky diodes in the mixer circuit according to the invention also contributes to a favorable performance in terms of noise, notably high-frequency noise.

CONCLUSION OF THE INVENTION

The Figures and their description above are illustrative of the invention rather than limit the invention. It is evident that there are numerous alternatives which are within the scope of the appended claims. With respect thereto, several conclusive remarks are made.

The functional entities or functions may be distributed in many different ways. In this respect it should be noted that the Figures are highly diagrammatic, each Figure representing only a single embodiment of the invention. For example, as regards FIG. 1, it may well be considered to have a single integrated circuit comprising the diode mixer circuit MIX, and the oscillator OSC. The input circuit INP may also be included in this integrated circuit, either fully or in part. The same thing is applied with respect to the intermediate frequency circuit IFC.

Although the FIG. 1 illustrates the application of a diode mixer circuit MIX according to the invention in a receiver, this does not exclude applications in other entities. For example, a diode mixer circuit according to the invention can also be applied in a digital processor for mixing two digital signals.

Although FIG. 4 illustrates a driving circuit DRIV formed on the basis of differential pairs of transistors, this does not exclude other embodiments. For example, the driving circuit may also be realized on the basis of operational amplifiers or on the basis of individual transistors.

Although FIG. 4 illustrates that diode-arranged transistors TD may be used for generating bias voltages, this does not exclude the use of other elements for this purpose. For example, also resistors may be used for generating bias voltages.

Finally, no reference sign between parentheses which is found in any claim is to be interpreted in a limitative fashion.

What is claimed is:

1. A diode mixer circuit for mixing a first and a second input signal (LO, RF), characterized in that a diode mixer circuit comprises a driving circuit (DRIV) for producing a first, second, third and fourth drive signal (DS1, DS2, DS3, DS4), each drive signal being a combination of the first and the second input signal (LO, RF), the first and the second input signal (LO, RF) having the following signs in the first, second, third and fourth drive signal: +/+(DS1: +LO+RF), +/−(DS2: +LO−RF), −/+(DS3: −LO+RF) AND −/−(DS4:−LO−RF) respectively; and a group of diodes (D1–D4) comprising a first, second, third and fourth diode (D1, D2, D3, D4) which are coupled for transferring the first, second, third and fourth drive signal (DS1, DS2, DS3, DS4) respectively, to an output, the first and fourth diodes (D1, D4) having the same polarity relative to the output (O1), and the second and third diodes (D2, D3) having the same polarity relative to the output (O1), but opposite to that of the first and fourth diodes (D1, D4).

2. A diode mixer circuit as claimed in claim 1, characterized in that the mixer circuit includes an additional group of diodes (D5–D8) containing a fifth, sixth, seventh and eighth diode (D5, D6, D7, D8) coupled for transferring the first, second, third and fourth drive signal (DS1, DS2, DS3, DS4) respectively, to an additional output (O2), the fifth, sixth, seventh and eighth diodes (D5, D6, D7, D8) being coupled the other way around relative to the first, second, third and fourth diodes (D1, D2, D3, D4), respectively.

3. A diode mixer circuit as claimed in claim 1, characterized in that the driving circuit (DRIV) comprises means (TD1–TD4) for producing bias voltages (Vbias1, Vbias2) between the first and third diodes (D1, D3) and between the second and fourth diodes (D2, D4), respectively.

4. A receiver comprising:

an input circuit (INP) for processing a received signal;

an oscillator (OSC) for producing a beat signal;

a mixer circuit (MIX) as claimed in claim 1, coupled for mixing the received signal processed by the input circuit (INP) and the beat signal produced by the oscillator (OSC) so as to obtain an intermediate frequency signal (IF); and an intermediate frequency circuit (IFC) for processing the intermediate frequency signal (IF).

* * * * *